(12) United States Patent
Cerafogli et al.

(10) Patent No.: US 11,989,443 B2
(45) Date of Patent: May 21, 2024

(54) TECHNIQUES FOR ENHANCED READ PERFORMANCE ON REPURPOSED BLOCKS OF MEMORY CELLS

(71) Applicant: Micron Technology, Inc., Boise, ID (US)

(72) Inventors: Chiara Cerafogli, Boise, ID (US); Carla L. Christensen, Boise, ID (US); Iolanda Del Villano, Villa di Briano (IT); Lalla Fatima Drissi, Ottaviano (IT); Anna Scalesse, Arzano (IT); Maddalena Calzolari, Milan (IT)

(73) Assignee: Micron Technology, Inc., Boise, ID (US)

(*) Notice: Subject to any disclaimer, the term of this patent is extended or adjusted under 35 U.S.C. 154(b) by 77 days.

(21) Appl. No.: 17/663,139

(22) Filed: May 12, 2022

(65) Prior Publication Data
US 2023/0367504 A1    Nov. 16, 2023

(51) Int. Cl.
*G06F 3/06* (2006.01)

(52) U.S. Cl.
CPC .......... *G06F 3/0655* (2013.01); *G06F 3/0604* (2013.01); *G06F 3/064* (2013.01); *G06F 3/0679* (2013.01)

(58) Field of Classification Search
CPC ...... G06F 3/064; G06F 3/0655; G06F 3/0604; G06F 3/0679
See application file for complete search history.

(56) References Cited

U.S. PATENT DOCUMENTS

| | | | |
|---|---|---|---|
| 2019/0121551 A1* | 4/2019 | Lee | G06F 3/064 |
| 2019/0391914 A1* | 12/2019 | Hsiao | G11C 11/5642 |
| 2020/0174667 A1* | 6/2020 | Lee | G06F 3/064 |

* cited by examiner

*Primary Examiner* — Jane W Benner
(74) *Attorney, Agent, or Firm* — Holland & Hart LLP

(57) ABSTRACT

Methods, systems, and devices for techniques for enhanced read performance on blocks of memory cells are described. The method may involve selecting a first block of memory cells from a set of blocks of memory cells of a memory system based on a condition of the first block of memory cells being met and setting one or more programming parameters corresponding to the first block of memory cells such that the one or more programming parameters are within a threshold value of one or more programming parameters corresponding to a second block associated with a storage density different from a storage density of the first block of memory cells. Further, the method may involve performing an operation on the block of memory cells according to the one or more programming parameters.

24 Claims, 8 Drawing Sheets

TECHNIQUES FOR ENHANCED READ PERFORMANCE ON REPURPOSED BLOCKS OF MEMORY CELLS

FIELD OF TECHNOLOGY

The following relates to one or more systems for memory, including techniques for enhanced read performance on blocks of memory cells.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
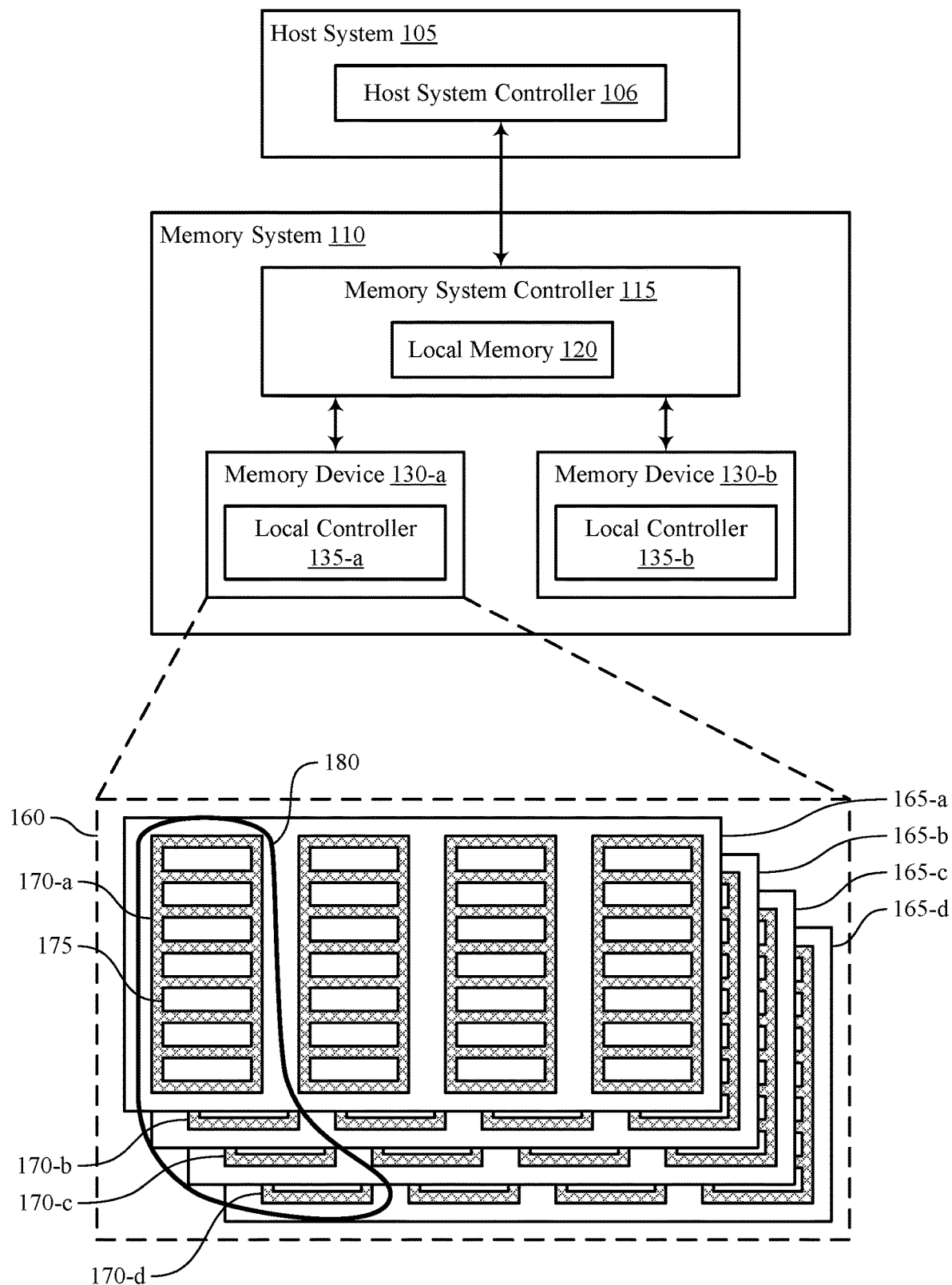
FIG. 1 illustrates an example of a system that supports techniques for enhanced read performance on blocks of memory cells in accordance with examples as disclosed herein.

In some examples, a memory system may include an array of memory cells, where each memory cell of the array is configured to store one or more bits of information. The array of memory cells may be divided into blocks of memory cells. The multiple blocks of memory cells may have different storage characteristics and may be accessed independent from one another. Performing multiple access operations (e.g., read operations, write operations) on the blocks of memory cells may degrade the blocks of memory cells. As one example, continually accessing the blocks of memory cells may distort the logic values stored by the block of memory cells resulting in relatively large read latencies. Once a block of memory cells reaches some level of degradation, the memory system may retire the block of memory cells. In some examples, the memory system may determine to retire the block of memory cells because a read latency associated with the block of memory cells may be relatively large (e.g., exceeds a threshold). A block of memory cells that is retired may be inaccessible to the memory system. However, although the block of memory cells may exhibit degradation properties, the block of memory cells may not be completely unusable by the memory system. Retired blocks of memory cells may be usable in a different state and prematurely retiring the block of memory cells may be wasteful and unsustainable, and decrease a performance of the memory system.

In some examples, the memory system or the host system may repurpose blocks of memory cells that are near wear out. The memory system or the host system may initially set a block of memory cells to a storage state. The storage state may refer to a storage density of the memory cells or an access mode of the block of memory cells. As the block of memory cells is accessed, the memory system or the host system may determine (e.g., obtain) health metrics associated with the block of memory cells. Examples of the health metrics may be a duration to perform a read operation on the block of memory cells, a duration associated with writing logic states to the block of memory cells, a quantity of write operations performed on the block of memory cells, etc.

In response to the health metrics, the memory system or the host system may determine to repurpose the block of memory cells. That is, the health metrics may indicate that the block of memory cells is nearing an end of life. As one example, repurposing the block of memory cells may include updating the storage state of the block of memory cells. For example, the memory system or the host system may change (e.g., decrease) the storage density of the block of memory cells, or the memory system or the host system may set the block of memory cells to a mode of access, such as a read-only mode of access.

Additionally or alternatively to update the storage state of the block of memory cells, the memory system may enhance a read performance of the block of memory cells by adjusting one or more programming parameters of the block of memory cells. For example, the memory system or the host system may update a page type of pages included in the block of memory cells from a first type (e.g., default page type) to a second type (e.g., special page type). The first type may specify that pages of blocks of different storage densities may correspond to different programming parameters, whereas the second type may specify that pages of block of different storage densities may correspond to the same or similar programming parameters. As one example, the memory system may update pages included in the block of memory cells from the first type to the second type by increasing a programming time of pages of the block of memory cells (e.g., a programming time to write logic states to the block of memory cells) such that the programming time reflects a programming time used to program pages of a higher storage density block of memory cells resulting in an increased read window for the block of memory cells. Upon block repurposing, the memory system may access the block of memory cells according to updated storage state or the enhanced read performance. The methods as described herein may allow for blocks of memory cells nearing wear out to be repurposed for other operations increasing the sustainability of the memory system.

Figure 2:
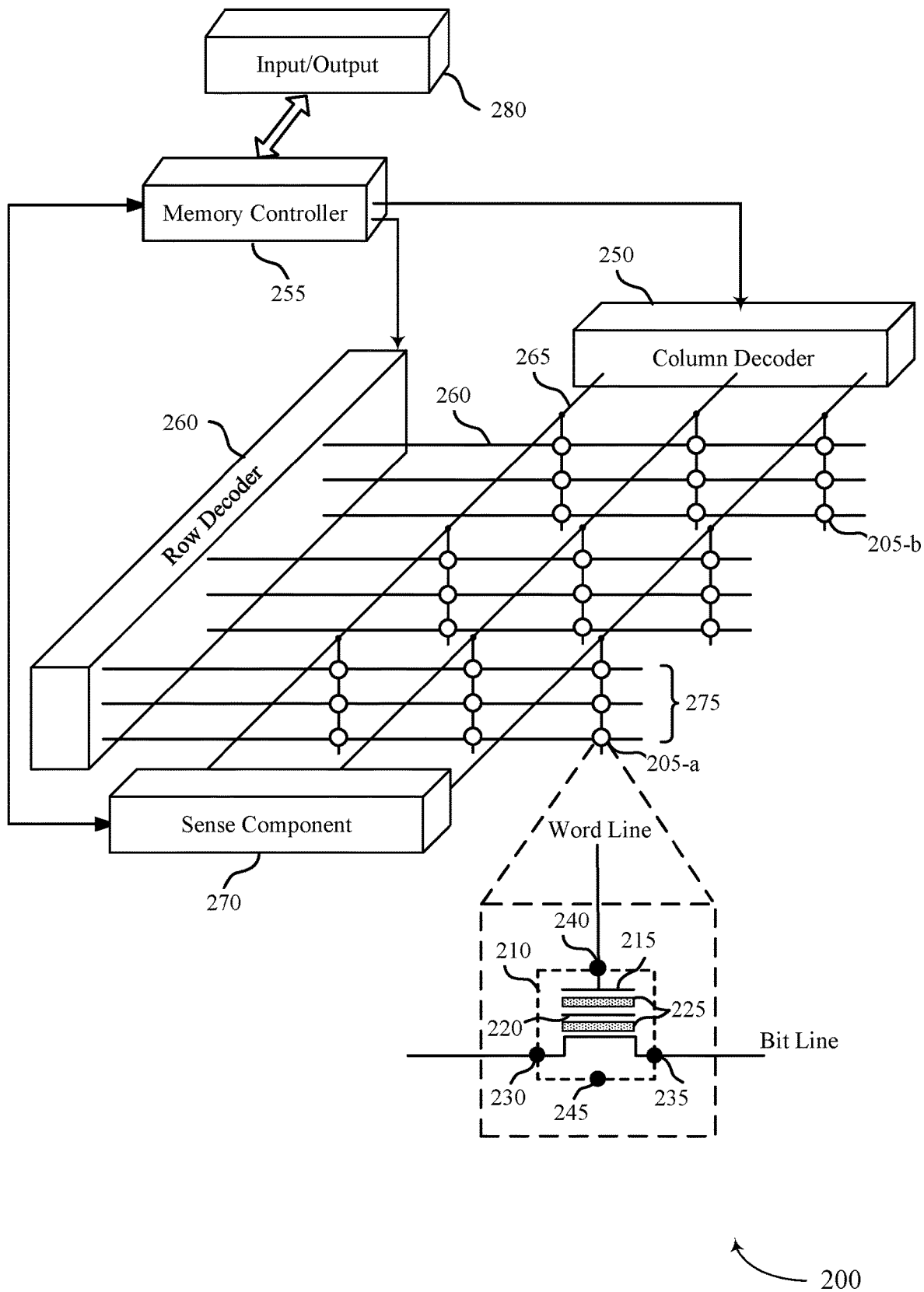
FIG. 2 illustrates an example of a memory device that supports techniques for enhanced read performance on blocks of memory cells in accordance with examples as disclosed herein.
Figure 3:
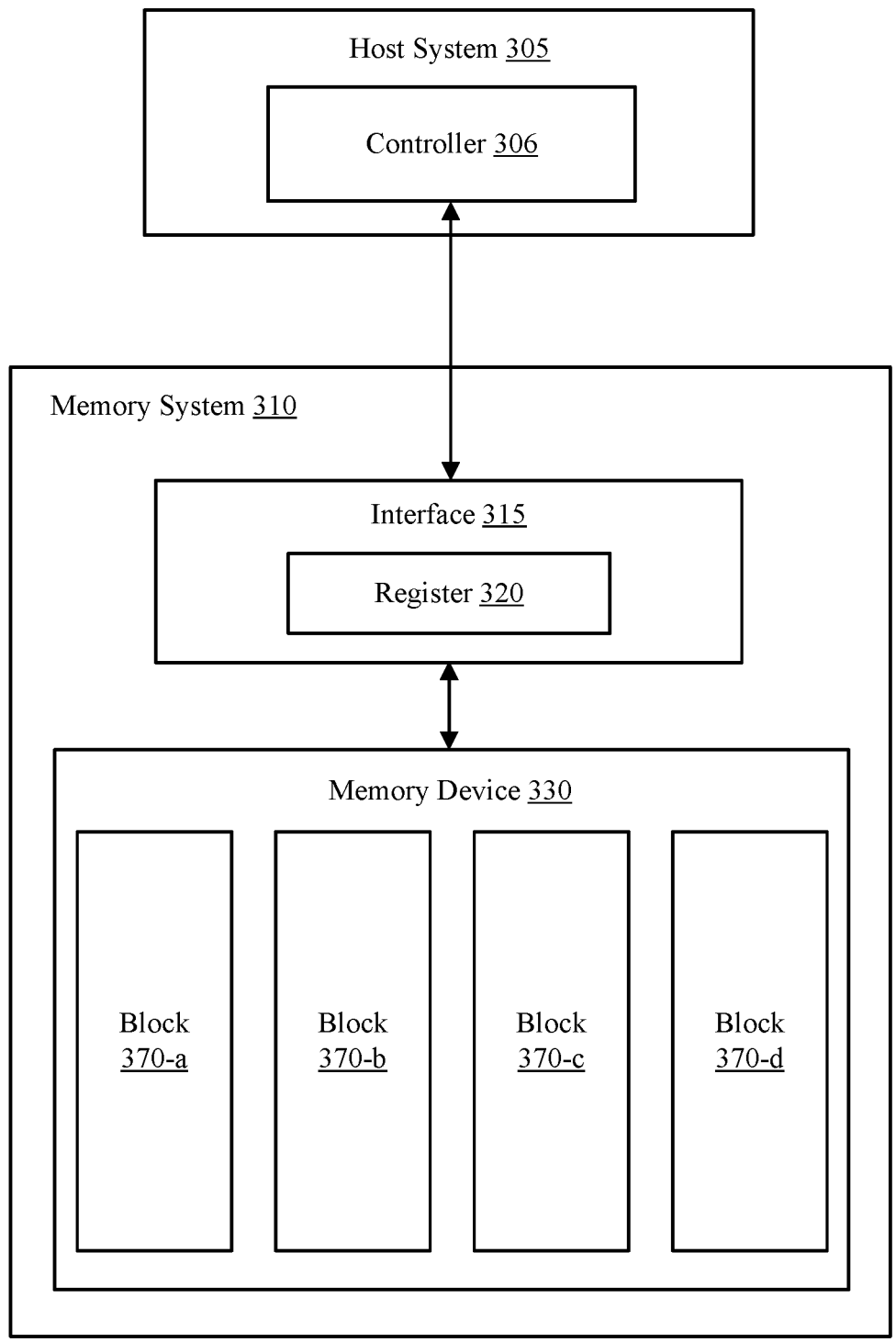
FIG. 3 illustrates an example of a system that supports techniques for enhanced read performance on blocks of memory cells in accordance with examples as disclosed herein.

Features of the disclosure are initially described in the context of systems and a device with reference to FIGS. 1 through 3. Features of the disclosure are described in the context of flow diagrams and a graph with reference to FIGS. 4 and 5. These and other features of the disclosure are further illustrated by and described in the context of an apparatus diagram and flowcharts that relate to block repurposing based on health metrics with reference to FIGS. 6-11.

FIG. 1 illustrates an example of a system 100 that supports techniques for enhanced read performance on blocks of memory cells in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hardcoded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may, in some cases, be performed instead by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-*a* may include a local controller 135-*a* and a memory device 130-*b* may include a local controller 135-*b*.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells or triple level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-*a*, 170-*b*, 170-*c*, and 170-*d* that are within planes 165-*a*, 165-*b*, 165-*c*, and 165-*d*, respectively, and blocks 170-*a*, 170-*b*, 170-*c*, and 170-*d* may be collectively referred to as a virtual block 180. In some cases, a virtual block may include blocks 170 from different memory devices 130 (e.g., including blocks in one or more planes of memory device 130-*a* and memory device 130-*b*). In some cases, the blocks 170 within a virtual block may have the same block address within their respective planes 165 (e.g., block 170-*a* may be "block 0" of plane 165-*a*, block 170-*b* may be "block 0" of plane 165-*b*, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

In some cases, to update some data within a block 170 while retaining other data within the block 170, the memory device 130 may copy the data to be retained to a new block 170 and write the updated data to one or more remaining pages of the new block 170. The memory device 130 (e.g., the local controller 135) or the memory system controller 115 may mark or otherwise designate the data that remains in the old block 170 as invalid or obsolete and may update a logical-to-physical (L2P) mapping table to associate the logical address (e.g., LBA) for the data with the new, valid block 170 rather than the old, invalid block 170. In some cases, such copying and remapping may be performed instead of erasing and rewriting the entire old block 170 due to latency or wear out considerations, for example. In some cases, one or more copies of an L2P mapping table may be stored within the memory cells of the memory device 130 (e.g., within one or more blocks 170 or planes 165) for use (e.g., reference and updating) by the local controller 135 or memory system controller 115.

In some cases, L2P mapping tables may be maintained and data may be marked as valid or invalid at the page level of granularity, and a page 175 may contain valid data, invalid data, or no data. Invalid data may be data that is outdated due to a more recent or updated version of the data being stored in a different page 175 of the memory device 130. Invalid data may have been previously programmed to the invalid page 175 but may no longer be associated with a valid logical address, such as a logical address referenced by the host system 105. Valid data may be the most recent version of such data being stored on the memory device 130. A page 175 that includes no data may be a page 175 that has never been written to or that has been erased.

In some cases, a memory system controller 115 or a local controller 135 may perform operations (e.g., as part of one or more media management algorithms) for a memory device 130, such as wear leveling, background refresh, garbage collection, scrub, block scans, health monitoring, or others, or any combination thereof. For example, within a memory device 130, a block 170 may have some pages 175 containing valid data and some pages 175 containing invalid data. To avoid waiting for all of the pages 175 in the block 170 to have invalid data in order to erase and reuse the block 170, an algorithm referred to as "garbage collection" may be invoked to allow the block 170 to be erased and released as a free block for subsequent operations, such as write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the quantity of blocks 170 that have been erased may be increased such that more blocks 170 are available to store subsequent data (e.g., data subsequently received from the host system 105).

The system 100 may include any quantity of non-transitory computer readable media that support block repurposing based on health metrics. For example, the host system 105, the memory system controller 115, or a memory device 130 (e.g., a local controller 135) may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

As described herein, the memory system 110 or the host system 105 may support block repurposing for blocks 170. In some examples, blocks 170 may be set to a first storage state, such as an initial storage state. A storage state may refer to a storage density of the block 170 or an access mode of the block 170. The storage density of the block 170 may be SLC storage, MLC storage, TLC storage, or QLC storage and an access mode of the block 170 may be read-only, write-only, or neither. In some examples, the memory system 110 may monitor the health of the blocks 170 and construct a health report in response to the monitored health of the blocks 170. The health report may include health metrics for a virtual block of memory cells. In some examples, a virtual block may correspond to multiple blocks 170 and as such, the metrics included in the report may reflect the health of the multiple blocks 170 (e.g., average health information of the multiple blocks 170).

The host system 105 or the memory system 110 may use the health report, among other aspects, as a trigger for block selection. For example, if one or more metrics included in the health report satisfy a threshold (e.g., are higher than, equal to, lower than), block selection may be triggered.

Upon initiating block selection, the memory system 110 or the host system 105 may select at least one block 170 from the one or more blocks corresponding to the virtual block for repurposing. In some examples, the memory system 110 or the host system 105 block may select the block 170 for repurposing based on or in response to health metrics of the individual blocks 170. As such, the memory system 110 or the host system 105 may obtain health metrics associated with individual blocks 170 prior to selecting the block 170. The health metrics may include a quantity of read commands performed on the blocks 170, a quantity of byte failures associated with the blocks 170, etc. If the health metrics of the block 170 satisfy a threshold, the memory system 110 or the host system 105 may select the block 170 and trigger block repurposing. That is, the memory system 110 or the host system 105 may update a storage state of the block 170. In some examples, the memory system 110 or the host system 105 may downgrade the density. For example, the memory system 110 may update the storage state from an MLC storage state to an SLC storage state. Additionally or alternatively, the memory system 110 or the host system 105 may update the storage state such that the access mode of the block 170 is updated, for example is updated to read-only.

In addition or alternative to updating the storage state of the block 170, the memory system 110 or the host system 105 may update programming parameters associated with the block 170 upon selecting the block 170. As one example, the memory system 110 or the host system 105 may increase the time to program the block 170. For example, if the storage state of the block 170 is updated from a first storage state (e.g., an MLC storage state) to a second storage state (e.g., an SLC storage state), the memory system 110 or the host system 105 may use a programming time comparable to the program time used to program the block 170 in the first storage state (e.g., the MLC storage state), to program the block 170 in the second storage state (e.g., the SLC storage state). The excess programming time may allow for more accurate threshold voltage distributions and in turn, a larger read window. The memory system 110 or the host system 105 may then access the block 170 according to the updated state and/or the updated programming parameters. The method as described herein may allow a memory system 110 to repurpose blocks nearing their end of life which may increase the sustainability of the memory system 110.

FIG. 2 illustrates an example of a memory device 200 that supports techniques for enhanced read performance on blocks of memory cells in accordance with examples as disclosed herein. In some cases, the memory device 200 may be an example of a memory device 130 as described with reference to FIG. 1. FIG. 2 is an illustrative representation of various components and features of the memory device 200. As such, it should be appreciated that the components and features of the memory device 200 are shown to illustrate functional interrelationships, and not necessarily actual physical positions within the memory device 200. Further, although some elements included in FIG. 2 are labeled with a numeric indicator, some other corresponding elements are not labeled, even though they are the same or would be understood to be similar, in an effort to increase visibility and clarity of the depicted features.

The memory device 200 may include one or more memory cells, such as memory cell 205-a and memory cell 205-b. A memory cell 205 may be, for example, a flash or other type of NAND memory cell, such as in the blow-up diagram of memory cell 205-a.

Each memory cell 205 may be programmed to store a logic value representing one or more bits of information. In some cases, a single memory cell 205—such as an SLC memory cell 205—may be programmed to one of two supported states and thus may store one bit of information at a time (e.g., a logic 0 or a logic 1). In other cases, a single memory cell 205—such as an MLC, TLC, quad-level cell (QLC), or other type of multiple-level memory cell 205—may be programmed to one or more than two supported states and thus may store more than one bit of information at a time. In some examples, a single MLC memory cell 205 may be programmed to one of four supported states and thus may store two bits of information at a time corresponding to one of four logic values (e.g., a logic 00, a logic 01, a logic 10, or a logic 11). In some examples, a single TLC memory cell 205 may be programmed to one of eight supported states and thus may store three bits of information at a time corresponding to one of eight logic values (e.g., 000, 001, 010, 011, 100, 101, 110, or 111). In some examples, a single QLC memory cell 205 may be programmed to one of sixteen supported states and thus may store four bits of information at a time corresponding to one of sixteen logic values (e.g., 0000, 0001, . . . 1111).

In some cases, a multiple-level memory cell 205 (e.g., an MLC memory cell, a TLC memory cell, a QLC memory cell) may be physically different than an SLC cell. For example, a multiple-level memory cell 205 may use a different cell geometry or may be fabricated using different materials. In some cases, a multiple-level memory cell 205 may be physically the same or similar to an SLC cell, and other circuitry in a memory block (e.g., a controller, sense amplifiers, drivers) may be configured to operate (e.g., read and program) the memory cell as an SLC cell, or as an MLC cell, or as a TLC cell, etc.

Different types of memory cells 205 may store information in different ways. In a DRAM memory array, for example, each memory cell 205 may include a capacitor that includes a dielectric material (e.g., an insulator) to store a charge representative of a programmable state and thus the stored information. In an FeRAM memory array, as another example, each memory cell 205 may include a capacitor that includes a ferroelectric material to store a charge or a polarization representative of a programmable state and thus the stored information.

In some NAND memory arrays (e.g., flash arrays), each memory cell 205 may include a transistor that has a floating gate or a dielectric material for storing an amount of charge representative of the logic value. For example, the blow-up in FIG. 2 illustrates a NAND memory cell 205-a that includes a transistor 210 (e.g., a metal-oxide-semiconductor (MOS) transistor) that may be used to store a logic value. The transistor 210 has a control gate 215 and may also include a floating gate 220, where the floating gate 220 is sandwiched between two portions of dielectric material 225. Transistor 210 includes a first node 230 (e.g., a source or drain) and a second node 235 (e.g., a drain or source). A logic value may be stored in transistor 210 by placing (e.g., writing, storing) a quantity of electrons (e.g., an amount of charge) on floating gate 220. The amount of charge to be stored on the floating gate 220 may depend on the logic value to be stored. The charge stored on floating gate 220 may affect the threshold voltage of transistor 210, thereby affecting the amount of current that flows through transistor 210 when transistor 210 is activated (e.g., when a voltage is applied to the control gate 215).

A logic value stored in transistor 210 may be sensed (e.g., as part of a read operation) by applying a voltage to the control gate 215 (e.g., to control node 240, via the word line 260) to activate transistor 210 and measuring (e.g., detecting, sensing) the resulting amount of current that flows through the first node 230 or the second node 235 (e.g., via a digit line 265). For example, a sense component 270 may determine whether an SLC memory cell 205 stores a logic 0 or a logic 1 in a binary manner (e.g., based on a presence or absence of a current through the memory cell 205 when a read voltage is applied to the control gate 215, or based on whether the current is above or below a threshold current). For a multiple-level memory cell 205, a sense component 270 may determine a logic value stored in the memory cell 205 based on various intermediate threshold levels of current when a read voltage is applied to the control gate 215. In one example of a multiple-level architecture, a sense component 270 may determine the logic value of a TLC memory cell 205 based on eight different levels of current, or ranges of current, that define the eight potential logic values that could be stored by the TLC memory cell 205.

An SLC memory cell 205 may be written by applying one of two voltages (e.g., a voltage above a threshold or a voltage below a threshold) to memory cell 205 to store, or not store, an electric charge on the floating gate 220 and thereby cause the memory cell 205 store one of two possible logic values. For example, when a first voltage is applied to the control node 240 (e.g., via the word line 260) relative to a bulk node 245 for the transistor 210 (e.g., when the control node 240 is at a higher voltage than the bulk), electrons may tunnel into the floating gate 220. In some cases, the bulk node 245 may alternatively be referred to as a body node. Injection of electrons into the floating gate 220 may be referred to as programing the memory cell 205 and may occur as part of a program operation. A programmed memory cell may, in some cases, be considered as storing a logic 0. When a second voltage is applied to the control node 240 (e.g., via the word line 260) relative to the bulk node 245 for the transistor 210 (e.g., when the control node 240 is at a lower voltage than the bulk node 245), electrons may leave the floating gate 220. Removal of electrons from the floating gate 220 may be referred to as erasing the memory cell 205 and may occur as part of an erase operation. An erased memory cell may, in some cases, be considered as storing a logic 1. In some cases, memory cells 205 may be programmed at a page 175 level of granularity due to memory cells 205 of a page 175 sharing a common word line 260, and memory cells 205 may be erased at a block 170 level of granularity due to memory cells 205 of a block sharing commonly biased bulk nodes 245.

In contrast to writing an SLC memory cell 205, writing a multiple-level (e.g., MLC, TLC, or QLC) memory cell 205 may involve applying different voltages to the memory cell 205 (e.g., to the control node 240 or bulk node 245 thereof) at a finer level of granularity to more finely control the amount of charge stored on the floating gate 220, thereby enabling a larger set of logic values to be represented. Thus, multiple-level memory cells 205 may provide greater density of storage relative to SLC memory cells 205 but may, in some cases, involve narrower read or write margins or greater complexities for supporting circuitry.

A charge-trapping NAND memory cell 205 may operate similarly to a floating-gate NAND memory cell 205 but, instead of or in addition to storing a charge on a floating gate 220, a charge-trapping NAND memory cell 205 may store a charge representing a logic state in a dielectric material below the control gate 215. Thus, a charge-trapping NAND memory cell 205 may or may not include a floating gate 220.

In some examples, each row of memory cells 205 may be connected to a corresponding word line 260, and each column of memory cells 205 may be connected to a corresponding digit line 265. Thus, one memory cell 205 may be located at the intersection of a word line 260 and a digit line 265. This intersection may be referred to as an address of a memory cell 205. Digit lines 265 may alternatively be referred to as bit lines. In some cases, word lines 260 and digit lines 265 may be substantially perpendicular to one another and may create an array of memory cells 205. In some cases, word lines 260 and digit lines 265 may be generically referred to as access lines or select lines.

In some cases, memory device 200 may include a three-dimensional (3D) memory array, where multiple two-dimensional (2D) memory arrays may be formed on top of one another. This may increase the quantity of memory cells 205 that may be placed or fabricated on a single die or substrate as compared with 2D arrays, which, in turn, may reduce production costs, or increase the performance of the memory array, or both. In the example of FIG. 2, memory device 200 includes multiple levels (e.g., decks) of memory cell 205. The levels may, in some examples, be separated by an electrically insulating material. Each level may be aligned or positioned so that memory cells 205 may be aligned (e.g., exactly aligned, overlapping, or approximately aligned) with one another across each level, forming a memory cell stack 275. In some cases, a memory cell stack 275 may be referred to as a string of memory cells 205.

Accessing memory cells 205 may be controlled through row decoder 260 and column decoder 250. For example, row decoder 260 may receive a row address from memory controller 255 and activate an appropriate word line 260 based on the received row address. Similarly, column decoder 250 may receive a column address from memory controller 255 and activate an appropriate digit line 265. Thus, by activating one word line 260 and one digit line 265, one memory cell 205 may be accessed.

Upon accessing, a memory cell 205 may be read, or sensed, by sense component 270. For example, sense component 270 may be configured to determine the stored logic value of memory cell 205 based on a signal generated by accessing memory cell 205. The signal may include a current, a voltage, or both a current and a voltage on the digit line 265 for the memory cell 205 and may depend on the logic value stored by the memory cell 205. The sense component 270 may include various transistors or amplifiers configured to detect and amplify a signal (e.g., a current or voltage) on a digit line 265. The logic value of memory cell 205 as detected by the sense component 270 may be output via input/output component 280. In some cases, sense component 270 may be a part of column decoder 250 or row decoder 260, or sense component 270 may otherwise be connected to or in electronic communication with column decoder 250 or row decoder 260.

A memory cell 205 may be programmed or written by activating the relevant word line 260 and digit line 265 to enable a logic value (e.g., representing one or more bits of information) to be stored in the memory cell 205. A column decoder 250 or a row decoder 260 may accept data, for example from input/output component 280, to be written to the memory cells 205. As previously discussed, in the case of NAND memory, such as flash memory used in some NAND and 3D NAND memory devices, a memory cell 205 may be written by storing electrons in a floating gate or an insulating layer.

A memory controller 255 may control the operation (e.g., read, write, re-write, refresh) of memory cells 205 through the various components, for example, row decoder 260, column decoder 250, and sense component 270. In some cases, one or more of row decoder 260, column decoder 250, and sense component 270 may be co-located with memory controller 255. A memory controller 255 may generate row and column address signals in order to activate the desired word line 260 and digit line 265. In some examples, a memory controller 255 may generate and control various voltages or currents used during the operation of memory device 200.

As described herein, a host system or memory system may repurpose a block of memory cells. In some examples, the memory cells 205 may be separated into different blocks of memory cells. That is, each block of memory cells may include a portion of the memory cells 205. The host system or the memory system may obtain one or more metrics associated with one or more blocks (if not each block) of memory cells and compare at least one metric (e.g., a quantity of program/erase (P/E) cycles performed on the block of memory cells) to a threshold. If one or more metrics for a block satisfy a threshold (e.g., is above the threshold, is below the threshold), the memory device or the host device may initiate block repurposing. The metric satisfying the threshold may indicate that the block is nearing an end-of-life.

Block repurposing may include updating a storage density associated with the block of memory cells. As one example, the memory system or the host system may update the block from a first storage state (e.g., a QLC storage state, a TLC storage state, an MLC storage state) to a second storage state (e.g., an SLC storage state). That is, in some examples, through block repurposing, a quantity of bits stored at the memory cell of the block may decrease. Additionally, the memory system or the host system may update one or more programming parameters associated with the block of memory cells. As one example, the memory system or the host system may increase a time to program or a time to erase logic states from the block of memory cells. If the block of memory cells is updated from a first storage state (e.g., a QLC storage state, a TLC storage state, an MLC storage state) to a second storage state (e.g., an SLC storage state), the memory system or the host system may increase the programming time or erase time such that the programming time or the erase time is comparable to a higher density block (e.g., a QLC block, a TLC block, or an MLC block). Using other methods, the programming time for an QLC block, TLC block, or an MLC block is greater than a programming time for an SLC block due to the finer level granularity required for higher density blocks as described above. The excess time may allow for a memory system to program the SLC block of memory cells using a finer granularity and potentially enhance read operations.

FIG. 3 illustrates an example of a system 300 that techniques for enhanced read performance on blocks of memory cells in accordance with examples as disclosed herein. In some examples, the system 300 may include aspects of a system 100. For example, the system 300 may include a host system 305 and a memory system 310 which may be examples of a host system 105 and a memory system 310 as described with reference to FIG. 1. The host system 305 may include a controller 306 which may be in electronic communication with an interface 315 included at the memory system 310 such that the memory system 310 may communicate with the host system 305.

In some examples, the memory system 310 may include one or more memory devices 330. The memory devices 330 may be examples of storage devices that include an array of memory cells that are configured to store one or more bits of information. In some examples, the array of memory cells of each memory device 330 be divided into multiple blocks 370. For example, the memory array of the memory device 330 may be divided into a block 370-a, a block 370-b, a block 370-c, and a block 370-d. The blocks 370 may be isolated from one another allowing for the blocks 170 to be accessed (e.g., read or written) independently by the host system 305 or the memory system 310 and in some examples, the blocks 370 may be associated with different storage states. A storage state may refer to the storage density or the access mode of a block 370. As an example, the storage state of the block 370-a may be SLC storage, whereas a storage state of the block 370-b, the block 370-c, and the block 370-d may be MLC storage.

A block 370 may be also referred to as a physical block. A physical block may be a physical portion of the memory device 330 that includes memory cells, bit lines, word lines, and the like. The block 370 may also be associated with or be included in a virtual block. A virtual block may refer to a logical or physical arrangement of blocks 370. The memory system 310 may include multiple memory device 330 and therefore, may include multiple virtual blocks, where each virtual block may be composed of one or more blocks 370. In some examples, the memory system 305 may store a table (e.g., a L2PVBT) that includes mappings between virtual blocks and physical blocks. The memory system 305 may receive a command from the host system 310 associated with the virtual block and access the corresponding blocks 370 using the table. The host system 310 may also access individual block 370. For example, the memory system 310 may receive a command associated with a block 370 from the host system 305 and access the block 370 using an L2P table (e.g., a table that includes mappings between logical addresses and blocks 370.

If multiple access operations are performed on a block 370, the performance of the block 370 may degrade (e.g., degrade over time). As an example, performing multiple access operations on the block 370 may change or distort one or more logic states stored at memory cells of the block 370 resulting in an increase in read latency. That is, multiple read operation may be performed on the block 370 in order to read the stored logic states. To avoid excessive read latency, the memory system 310 may retire the block 370. That is, the block 370 may no longer be accessed by the memory system 310 or the host system 305. To determine when to retire the block 370, the memory system 310 may monitor the level of degradation of the block 370. In one example, the memory system 310 may monitor a read latency associated with block 370. If the read latency exceeds a threshold (e.g., an exhausted life threshold), the memory system 310 may retire the block 370. However, the block 370 may still be usable in an alternative state and prematurely retiring the block 370 may be wasteful.

In some examples, the system 300 may also support virtual block health reporting. To support virtual block reporting, the memory system 310 may monitor health metrics for each block 370. In some examples, the memory system 310 may use the health metrics to construct a virtual block health report. The virtual block report may include health information associated with a virtual block. In some examples, the virtual block may correspond to one block 370 or multiple blocks 370 and as such, the virtual block health report may include average health information for all the blocks 370 corresponding to the virtual block (e.g., average of the health metrics associated with each block 370 corresponding to the virtual block). As an example, the virtual block health report may include a quantity of bad blocks, a block erase count (e.g., minimum, maximum, or average) for blocks 370 of the same storage state corresponding to the virtual block (e.g., a block erase count for SLC blocks 370 and a block erase count for MLC blocks), an exhausted life for blocks 370 of the same storage state corresponding to the virtual block (e.g., exhausted life for SLC and exhausted life for MLC), etc. The host system 305 may transmit a command for the virtual block health report and the memory system 310 may generate the virtual health report in response to the command. Once generated, the memory system 310 may transmit the virtual block health report to the host system 305.

As described herein, the system 300 may support block repurposing for blocks 370 reaching end of life. In some examples, the host system 305 may transmit, via the controller 306, the command for virtual block health reporting to the memory system 310. The memory system 310 may receive the command at the interface 315 and generate a virtual block health report in response to the command. The memory system 310 may then transmit the virtual block health report to the host system 305. Using the virtual block health report, the host system 305 may determine whether to trigger block selection for block repurposing.

Upon triggering block selection, the host system 305 may transmit, via the controller 306, a command to the interface 315 of the memory system 310 to obtain health metrics for each block 370 corresponding to the virtual block (the block 370-a, the block 370-b, the block 370-c, and the block 370-d). Examples of the health metrics may be a duration to perform a read operation on a respective block 370, a duration associated with writing logic states to the respective block 370 (e.g., tPROG), a duration associated with erasing the logic states stored at the block 370 (e.g., tBER), a quantity of read operations performed on the block 370, a quantity of write operations performed on the block 370, a quantity of byte failures associated with the block 370 (e.g., CFBYTE), or any combination thereof.

In some examples, the host system 305 or the memory system 110 may select one or more blocks 370 whose health metrics satisfy a respective threshold. As one example, the host system 305 or the memory system 310 may select a block 370-b for repurposing because the quantity of write operations or the quantity of read operations performed on the block 370-a satisfies (e.g., is above, is equal to, is below) the respective threshold. Additionally, the memory system 310 or the host system 305 may select a block 370 that was indicated as a bad block in the virtual health report for block repurposing (e.g., if the bad block count is greater than 0).

Upon triggering block repurposing, the memory system 310 may repurpose the selected block. In one example, the memory system 310 may update the storage state of the selected block 370. That is, the memory system 310 may change the initial storage state of the selected block 370. In one example, the memory system 310 may update (e.g., decrease) the storage density of the selected block 370. As another example, the memory system 310 may update the access mode of the selected block 370. Once block purposing is complete, the memory system 310 may access the repurposed block 370 according to the updated storage state. Using block repurposing, the memory system may reuse a block 370 that would otherwise be discarded increasing the sustainability of the memory system.

In some examples, the memory system 310 or the host system 305 may enhance the read performance of a block 370. In some examples, the memory system 310 or the host system 305 may select a block 370 from the blocks 370 included in the memory device 330 for enhanced read performance. The selected block 370 may be a block 370 that has been previously repurposed or any other block 370. In some examples, the memory system 310 or the host system 305 may select a block 370 in response to one or more condition beings met or satisfied. An example of a condition being satisfied may be a quantity of read operations performed on a block 370 being above a threshold.

Upon selecting the block 370, the memory system 310 or the host system 305 may update one or more programming parameters associated with the block 370. Examples of the programming parameters may be a duration to program memory cells of the block 370 with one or more stored logic states (e.g., programming time) or a duration to erase the one or more logic states stored at the memory cells of the block 370 (e.g., erase time). In some examples, the memory system 310 or the host system 305 may increase the value of the one or more programming parameters. For example, the block 370 may include SLC memory cells. In such example, the memory system 310 or the host system 305 may increase the programming time of the block 370 such that the programming time is within a threshold value or the same value as a programming time corresponding to blocks 370 including MLC or TLC memory cells. Once the programming parameters are updated, the memory system 310 or the host system 305 may perform operations (e.g., a read operation, a program operation, an erase operation) on the block 370 according the updated programming parameters. The excess programming time may allow the memory system 310 to program the memory cells to have narrower and more spread out threshold voltage distributions (e.g., increase the read window for the block 370).

Figure 4:
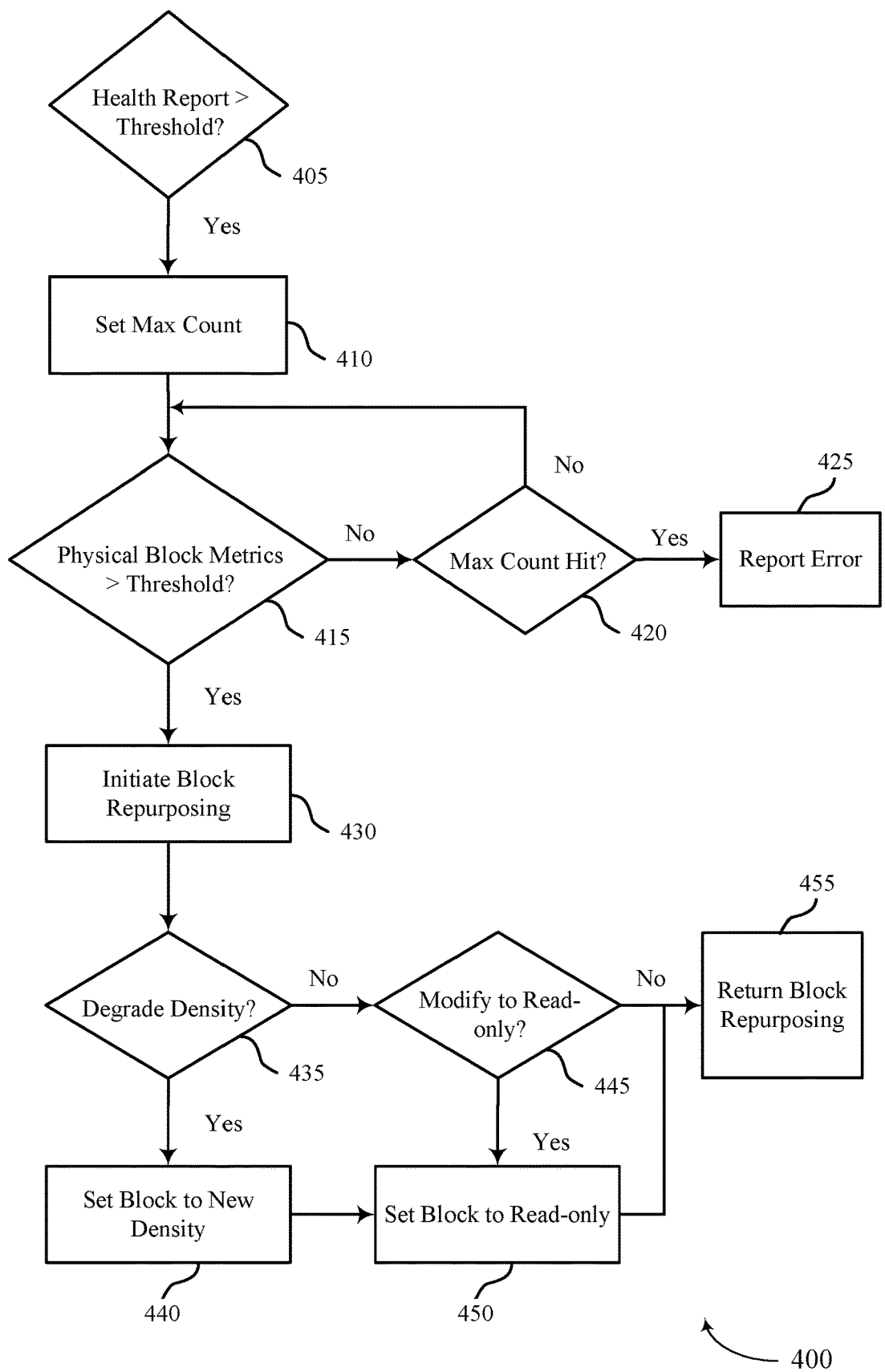
FIG. 4 illustrates an example of a flow diagram that supports techniques for enhanced read performance on blocks of memory cells in accordance with examples as disclosed herein.

FIG. 4 illustrates an example of a flow diagram 400 that supports techniques for enhanced read performance on blocks of memory cells in accordance with examples as disclosed herein. In some examples, the flow diagram 400 may include aspects of a system 100 and a system 300. For example, the flow diagram 400 may be implemented by a host system 105, a host system 305, a memory system 110, and a memory system 310 as described with reference to FIGS. 1 and 3.

Aspects of the flow diagram 400 may be implemented by a controller, among other components. Additionally or alternatively, aspects of the flow diagram 400 may be implemented as instructions stored in memory (e.g., firmware stored in a memory coupled with a host system or a memory system). For example, the instructions, when executed by a controller (e.g., the memory system controller or the host system controller), may cause the controller to perform the operations of the flow diagram 400.

At 405, a determination may be made on whether one or more metrics included in a health report are above a respective threshold. As an example, the one or more metrics may include an exhausted life for SLC blocks and an exhausted life for MLC blocks. If the memory system or the host system determines that one or more of the basic pool block metrics of the health report exceeds the respective threshold, the memory system or the host system may proceed to 410.

At 410, a max count for block selection performed during the block repurposing procedure may be set. After setting the max count for block selection, the memory system or the host system may proceed to 415.

At 415, one or more health metrics may be obtained for each physical block corresponding to the virtual block and a determination on whether one or more of the health metrics satisfies respective thresholds may be made. In some examples, the health metrics may include one or more of a duration to perform a read operation on the physical block, a duration associated with writing logic states to the physical block, a duration associated with erasing the logic states stored at the physical block, a quantity of read operations performed on the physical block, a quantity of write operations performed on the physical block, or a quantity of byte failures associated with the physical block. one or more of the health metrics of a physical block exceeds the respective thresholds, the memory system or the host system may select the block and proceed to 430. Alternatively, if the one or more of the health metrics of the physical block do not exceed the respective thresholds, the memory system of the host system may increment a counter and proceed to 420.

At 420, a determination may be made on whether the value of the counter hits the max count. If the value of the counter does not hit the max count, the memory system or the host system may repeat 415. If the value of the counter does hit the max count, the memory system or the host system may end the block repurposing procedure or the memory system may report an error to the host system at 425.

At 430, block repurposing may be initiated on the physical block selected at 415. In some examples, the memory system or the host system may initiate block repurposing on the physical block selected at 415 and proceed to 435. Repurposing the selected physical block may include updating a storage state (e.g., a storage density or an access mode) of the physical block of memory cells.

At 435, a determination on whether to downgrade a storage density of the block of memory cells as part of block repurposing may be made. In some examples, the memory system or the host system may determine to downgrade the storage density of the physical block in response to the initial storage density of the physical block. If the memory system determines to downgrade the density, the memory system or the host system may proceed to 440.

At 440, the physical block may be set to the new storage density (e.g., downgraded storage density). As an example, the memory system or the host system may downgrade the physical block from an MLC storage state to an SLC storage state.

At 445, a determination on whether to modify the access mode of the physical block may be made. An access mode may refer to how the physical block is accessed by the memory system or the host system. An example of an access mode may be a read-only access mode. In some examples, the memory system or the host system may determine to whether to modify the physical block to the read-only mode in response to a quantity of read operations performed on the physical block or a quantity of write operations performed on the physical prior to the block repurposing operation. As one example, the memory system or host system may determine to modify the physical block to read-only if one or both of the quantity of read operations performed on the physical block is greater than the threshold or the quantity of write operations performed on the physical block is less than the threshold. If the memory system or the host system determines to modify the access mode of the physical block, the memory system or the host system may proceed to 450.

At 450, the physical block may be set to a read-only mode of access. Setting the physical block of the read-only mode of access may not allow the memory system or the host system to write new information to the physical block or edit the information. Whether or not the host system or the memory system modifies the access mode of the physical block, the host system or the memory system may proceed to 455.

At 455, the block repurposing procedure is complete. In some examples, at 455, the memory system may transmit a report to the host system indicating the completion of the block repurposing procedure.

In some examples, following block repurposing, the repurposed physical block of memory cells may be updated to a special or enhanced page type. That is, the host system or memory system may update one or more programming parameters of the physical block of memory cells. Some examples of the programming parameters may be a duration to write logic states to the physical block of memory cells (e.g., programming time) or a duration to erase the logic states from the physical block of memory cells (e.g., erase time). In some examples, programming parameters may depend on the storage density of the physical block. For example, a programming time for a physical block of SLC memory cells may be less than the programming time for a physical block of QLC memory cells. This may be because a quantity of bits stored at an SLC memory cells is less than a quantity of bits stored at an QLC memory cell and thus, may require less time to program.

Updating the programming parameters may refer setting the programming parameters of the physical block of memory such that the programming parameters are comparable (e.g., within a threshold value) to programming parameters associated with a physical block of a different storage density. As an example, the physical block may include SLC memory cells. In such example, the memory system of the host system may set the programming parameters corresponding to the SLC block such that the programming parameters are equal to or comparable to programming parameters corresponding to an MLC block, a TLC block, or a QLC block. That is, the memory system or the host system may increase the program time for physical block. Using the excess time, the memory system or the host system may improve the threshold voltage distribution for the physical block of memory cells. The memory system or the host system may then access the physical block according to the updated or set programming parameters.

Figure 5A:
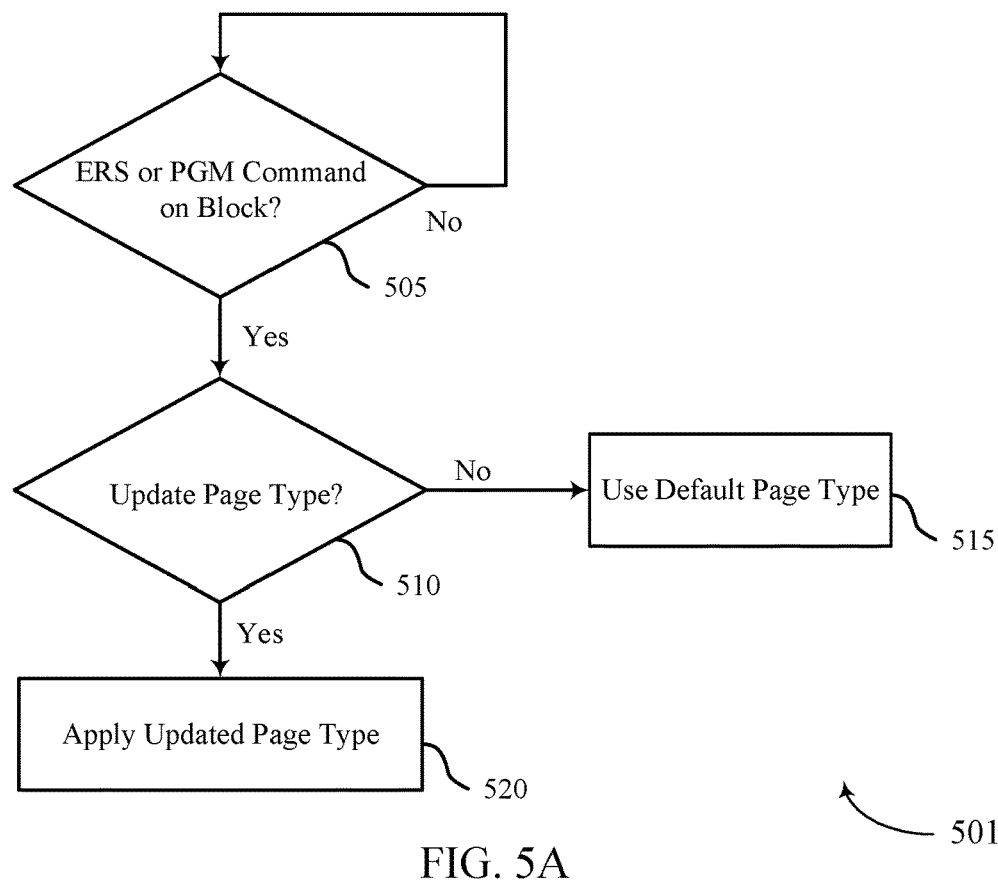
FIG. 5A illustrates an example of a flow diagram that supports techniques for enhanced read performance on blocks of memory cells in accordance with examples as disclosed herein.

FIG. 5A illustrates an example of a flow diagram 501 that supports techniques for enhanced read performance on blocks of memory cells in accordance with examples as disclosed herein. In some examples, the flow diagram 501 may include aspects of a system 100 and a system 300. For example, the flow diagram 501 may be implemented by a host system 105, a host system 305, a memory system 110, and a memory system 310 as described with reference to FIGS. 1 and 3.

Figure 5B:
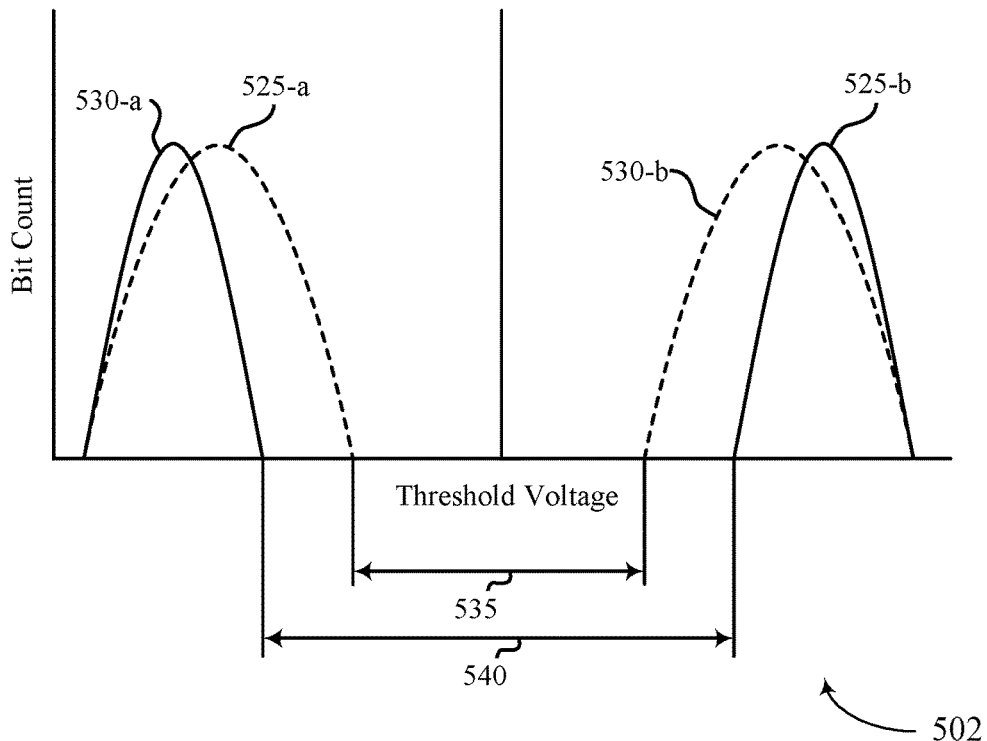
FIG. 5B illustrates an example of a graph that supports techniques for enhanced read performance on blocks of memory cells in accordance with examples as disclosed herein.

FIG. 5B illustrates an example of a graph 502 that supports techniques for enhanced read performance on blocks of memory cells in accordance with examples as disclosed herein. The x-axis of the graph 502 may represent threshold voltage values and the y-axis of the graph may represent bit count values. In some examples, the graph 502 may implement aspects of a system 100 and a system 300 as described in FIGS. 1 and 3.

Aspects of the flow diagram 501 may be implemented by a controller, among other components. Additionally or alternatively, aspects of the flow diagram 501 may be implemented as instructions stored in memory (e.g., firmware stored in a memory coupled with a host system or a memory system). For example, the instructions, when executed by a controller (e.g., the memory system controller, the host system controller), may cause the controller to perform the operations of the flow diagram 501.

At 505, a determination may be made about whether an erase command or a program command is received for one or more physical blocks of memory cells. In some examples, the memory system may determine whether an erase command or a program command is received for the one or more physical blocks of memory cells. The erase command (e.g., a block erase command) may instruct the memory system to erase logic states stored at the memory cells of the physical block. The program command may instruct the memory system to program the bits in the physical block to some logic value (e.g., 1 or 0). A duration to perform either the erase command or the program command may depend on a storage density associated with the physical block.

Using other methods, the duration to perform the erase command or the program command on a physical block of greater density (e.g., a TLC block or an MLC block) may be greater than the duration to perform the erase command or the program command on a lesser density block (e.g., an SLC block). This is because more bits may be stored at the greater density than at the lesser density. The more bits that are stored at a memory cell, the tighter the threshold voltage densities representing the different logic states may be which takes more time to program and erase. If the memory system determines that an erase command or a program command has been received, the memory system may proceed to 510. In some examples, the physical block may be a repurposed block. That is, the physical block may be block that has undergone block repurposing as described in FIG. 4.

At 510, a determination on whether to update a page type of pages corresponding to the physical block may be made. In some examples, the memory system may determine whether to update a page type of the pages corresponding to the physical block in response to one or more metrics associated with the physical block satisfying a respective threshold. The one or metrics may include a quantity of read commands performed on the physical block, a quantity of write commands performed on the physical block, or a quantity of PIE cycles performed on the physical block. As one example, the memory system may determine to update the page type of the pages if the quantity of read commands performed on the physical block is above a respective threshold or if the quantity of PIE cycles performed on the physical block is below a threshold.

Initially, the pages of the physical block may be set to a first page type. The first page type may specify that pages included in physical blocks of different storage densities may have different programming parameters. An example of a programming parameter may be the duration to the perform the erase command or the duration to perform the erase command. As an example, at a first page type, a duration to perform a program command on pages of an MLC block may be different (e.g., greater) than a duration to perform a program command on pages of an SLC block. The second page type may specify that pages includes in physical blocks of different density may share or have similar programming parameters. As an example, at a second page type (e.g., enhanced page), a duration to perform a program command on pages of an MLC block may be the same or within a threshold value of a duration to perform a program command on pages of an SLC block. If the memory system does not determine to update the page type, the memory system may proceed to 515 and use the default page type (e.g., first page type). Alternatively, if the memory system does determine to update the page type, the memory system may proceed to 520.

At 520, the page type may be updated and applied to pages of the physical block of memory cells. In some examples, the memory system may update the page type and apply the updated page type. In one example, the memory system may update the pages corresponding to the physical block from the first page type to the second page type. The graph 502 shows the threshold voltages of the physical block before (e.g., threshold voltage distribution 525) and (e.g., threshold voltage distribution) after the updated page type is applied. The threshold voltage distribution 525-a and the threshold distribution 530-a represent threshold voltages of memory cells storing a bit with a first logic value (e.g., 0) and the threshold voltage distribution 525-b and the threshold distribution 530-b represent threshold voltages of memory cells storing a bit with a second logic value (e.g., 1).

As described above, if the memory system updates the page type of pages include in the physical block from the first page type to the second page type, the programming parameters of pages of different density blocks may be shared or similar. As such, if the physical block is an example of an SLC block, the pages of the physical block may share or have similar programming parameters to pages of MLC blocks, TLC blocks, or any other higher density block. In one example, the programming parameters may be the duration to perform the programming command on the physical block. In such example, the duration to perform the programming command may increase for pages of the SLC block compared to when the pages were the first type (e.g., increase to be the same value or within a threshold value of a duration to perform a programming command on a MLC block, TLC block, or any higher density block).

The excess programming time may allow the memory system to program pages of the physical block with narrower or better placed threshold voltage distributions 530. With the ability to control the placement of the voltage distributions 530, the memory system may increase the read performance. For example, the memory system may increase the read window from a read window 535 (e.g., read window while the pages are set to the first type) to a read window 540 (e.g., read window while pages are set to the second type). The read window may refer to the difference between threshold distributions of representing different logic states. As the read window decreases, it may be harder for the memory system to distinguish logic values apart and can sometimes result in multiple read operations. As such, increasing the read window may increase the efficiency of the memory system.

Figure 6:
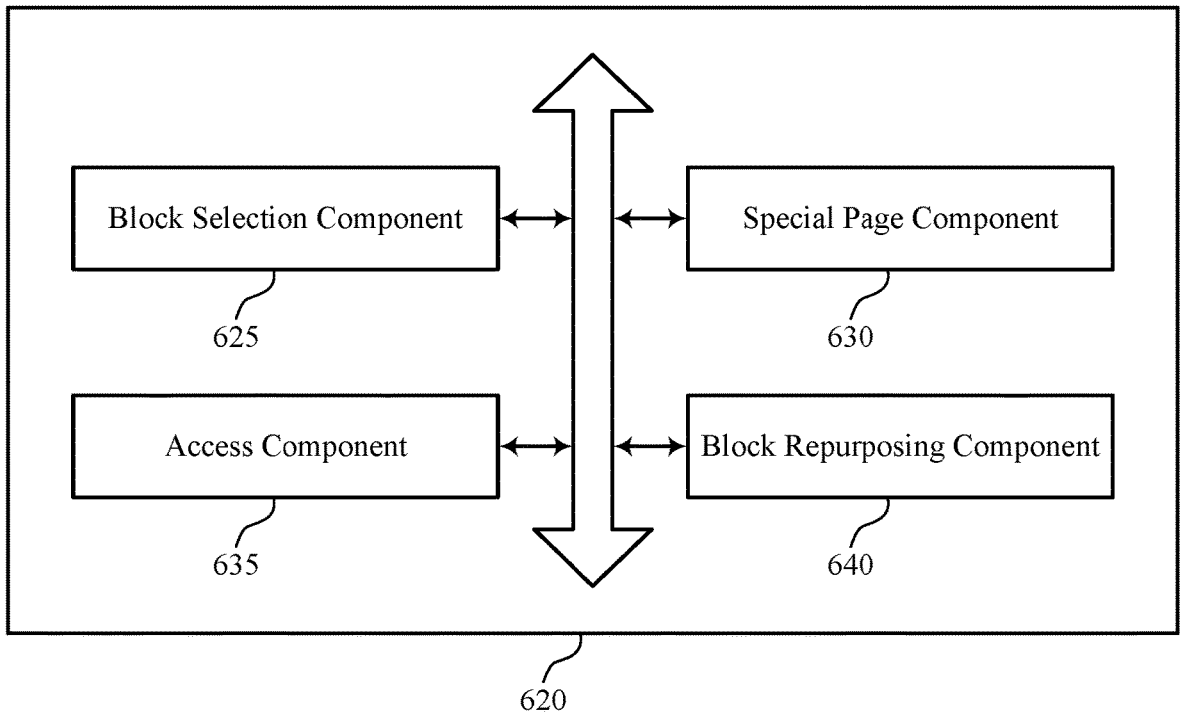
FIG. 6 shows a block diagram of a memory system or a host system that supports techniques for enhanced read performance on blocks of memory cells in accordance with examples as disclosed herein.

FIG. 6 shows a block diagram 600 of a memory system or host system 620 that supports techniques for enhanced read performance on blocks of memory cells in accordance with examples as disclosed herein. The memory system or host system 620 may be an example of aspects of a memory system or a host system as described with reference to FIGS. 1 through 5. The memory system or host system 620, or various components thereof, may be an example of means for performing various aspects of techniques for enhanced read performance on blocks of memory cells as described herein. For example, the memory system or host system 620 may include a block selection component 625, a special page component 630, an access component 635, a block repurposing component 640, or any combination thereof. Each of these components may communicate, directly or indirectly, with one another (e.g., via one or more buses).

The block selection component 625 may be configured as or otherwise support a means for selecting a first block of memory cells from a plurality of blocks of memory cells of a memory system based at least in part on a condition of the first block of memory cells being satisfied, where the first block of memory cells is at a first storage density. The special page component 630 may be configured as or otherwise support a means for setting one or more first programming parameters associated with the first block of memory cells to a first value that is within a threshold of a second value corresponding to one or more second programming parameters associated with a second block of memory cells at a second storage density, where the second storage density is greater than the first storage density. The access component 635 may be configured as or otherwise support a means for performing an operation on the first block of memory cells according to the one or more first programming parameters.

In some examples, the block repurposing component 640 may be configured as or otherwise support a means for updating a storage density of the first block of memory cells from a third storage density to the first storage density, where the third storage density is greater than the first storage density.

In some examples, the third storage density includes one of MLC storage, TLC storage, or QLC storage and the first storage density includes one of SLC storage, MLC storage, TLC storage, or QLC storage different from the third storage density.

In some examples, to support performing the operation on the first block of memory cells, the access component 635 may be configured as or otherwise support a means for performing a write operation or a block erase operation on the first block of memory cells.

In some examples, the access component 635 may be configured as or otherwise support a means for performing a second write operation or a second block erase operation on a third block of memory cells at the first storage density according to one or more third programming parameters, where the one or more third programming parameters are different from the one or more first programming parameters.

In some examples, the one or more first programming parameters include a first duration to write one or more logic states to the first block of memory cells and the one or more third programming parameters include a second duration to write one or more logic states to the third block of memory cells, the first duration greater than the second duration.

In some examples, the one or more first programming parameters include a first duration to erase one or more logic states stored at the first block of memory cells and the one or more third programming parameters include a second duration to erase one or more logic states stored at the third block of memory cells, the first duration greater than the second duration.

In some examples, differences between respective threshold voltages of respective logic states stored at the first block of memory cells is greater than differences between respective threshold voltages of respective logic states stored at the third block of memory cells.

In some examples, the access component 635 may be configured as or otherwise support a means for setting an access mode of the first block of memory cells to a read-only mode based at least in part on selecting the first block of memory cells, where setting the one or more first programming parameters is based at least in part on setting the access mode of the first block of memory cells to read-only.

In some examples, the access component 635 may be configured as or otherwise support a means for receiving, at the memory system, a command to erase one or more logic states stored at the first block of memory cells or program the first block of memory cells, where performing the operation on the first block of memory cells according to the one or more first programming parameters is based at least in part on the command.

In some examples, the block selection component 625 may be configured as or otherwise support a means for determining that the condition of the first block of memory cells is satisfied.

In some examples, to support determining that the condition of the first block of memory cells is satisfied, the block selection component 625 may be configured as or otherwise support a means for determining that a quantity of program/erase operations performed on the first block of memory cells is below a first threshold. In some examples, to support determining that the condition of the first block of memory cells is satisfied, the block selection component 625 may be configured as or otherwise support a means for determining that a quantity of write operations performed on the first block of memory cells is below a second threshold. In some examples, to support determining that the condition of the first block of memory cells is satisfied, the block selection component 625 may be configured as or otherwise support a means for determining that a quantity of read operations performed on the first block of memory cells is above a third threshold.

In some examples, the memory system includes a plurality of pages, and the special page component 630 may be configured as or otherwise support a means for updating pages corresponding to the first block of memory cells from the second page type to the first page type based at least in part on performing the operation on the first block of memory cells according to the one or more first programming parameters.

Figure 7:
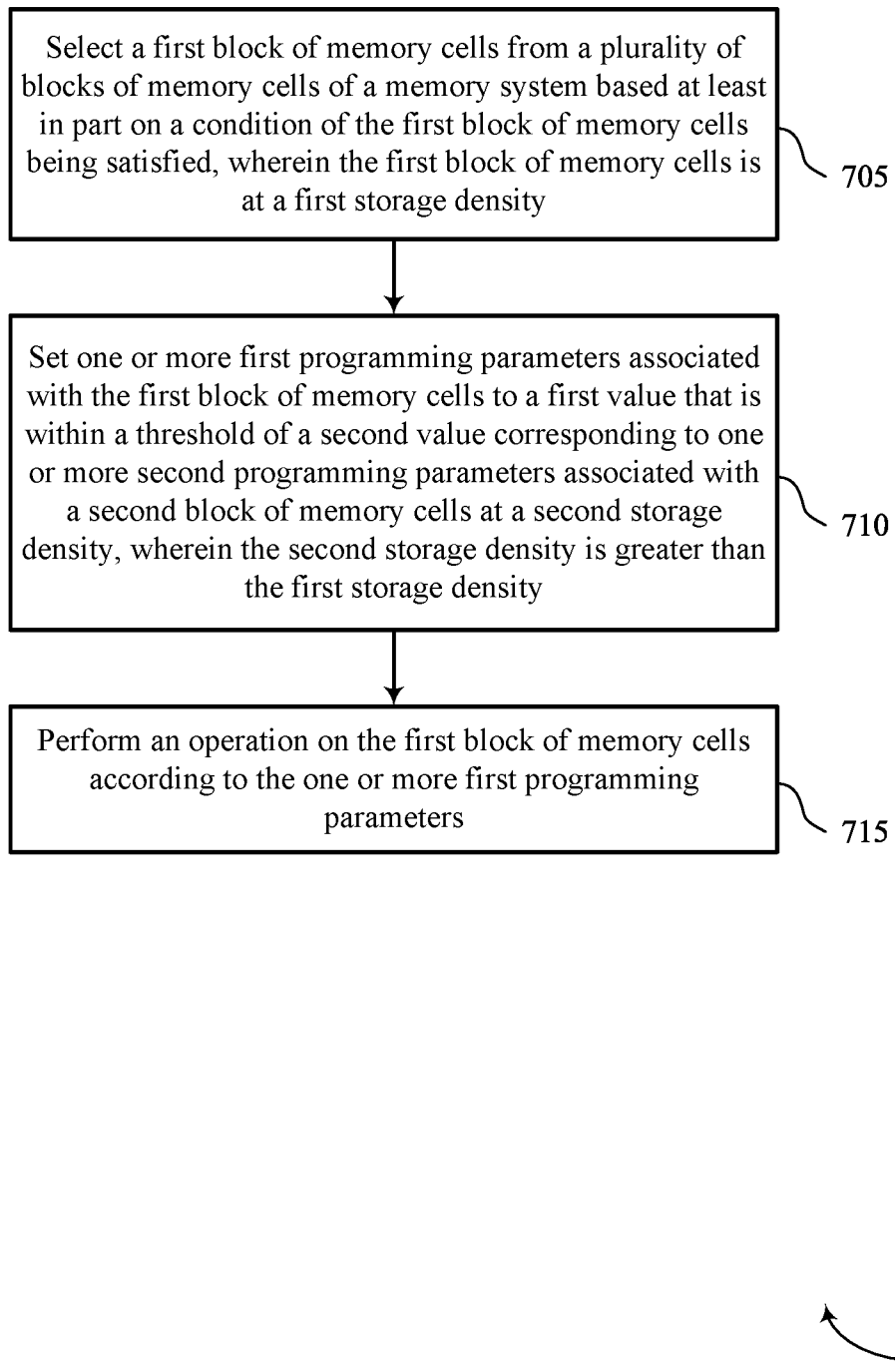
FIGS. 7 and 8 show flowcharts illustrating a method or methods that support techniques for enhanced read performance on blocks of memory cells in accordance with examples as disclosed herein.

FIG. 7 shows a flowchart illustrating a method 700 that supports techniques for enhanced read performance on blocks of memory cells in accordance with examples as disclosed herein. The operations of method 700 may be implemented by a memory system or a host system or its components as described herein. For example, the operations of method 700 may be performed by a memory system or a host system as described with reference to FIGS. 1 through 6. In some examples, a memory system or a host system may execute a set of instructions to control the functional elements of the device to perform the described functions. Additionally or alternatively, the memory system or the host system may perform aspects of the described functions using special-purpose hardware.

At 705, the method may include selecting a first block of memory cells from a plurality of blocks of memory cells of a memory system based at least in part on a condition of the first block of memory cells being satisfied, where the first block of memory cells is at a first storage density. The operations of 705 may be performed in accordance with examples as disclosed herein. In some examples, aspects of the operations of 705 may be performed by a block selection component 625 as described with reference to FIG. 6.

At 710, the method may include setting one or more first programming parameters associated with the first block of memory cells to a first value that is within a threshold of a second value corresponding to one or more second programming parameters associated with a second block of memory cells at a second storage density, where the second storage density is greater than the first storage density. The operations of 710 may be performed in accordance with examples as disclosed herein. In some examples, aspects of the operations of 710 may be performed by a special page component 630 as described with reference to FIG. 6.

At 715, the method may include performing an operation on the first block of memory cells according to the one or more first programming parameters. The operations of 715 may be performed in accordance with examples as disclosed herein. In some examples, aspects of the operations of 715 may be performed by an access component 635 as described with reference to FIG. 6.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for selecting a first block of memory cells from a plurality of blocks of memory cells of a memory system based at least in part on a condition of the first block of memory cells being satisfied, where the first block of memory cells is at a first storage density; setting one or more first programming parameters associated with the first block of memory cells to a first value that is within a threshold of a second value corresponding to one or more second programming parameters associated with a second block of memory cells at a second storage density, where the second storage density is greater than the first storage density; and performing an operation on the first block of memory cells according to the one or more first programming parameters.

Aspect 2: The method, apparatus, or non-transitory computer-readable medium of aspect 1, further including operations, features, circuitry, logic, means, or instructions, or any combination thereof for updating a storage density of the first block of memory cells from a third storage density to the first storage density, where the third storage density is greater than the first storage density.

Aspect 3: The method, apparatus, or non-transitory computer-readable medium of aspect 2 where the third storage density includes one of MLC storage, TLC storage, or QLC storage and the first storage density includes one of SLC storage, MLC storage, TLC storage, or QLC storage different from the third storage density.

Aspect 4: The method, apparatus, or non-transitory computer-readable medium of any of aspects 1 through 3 where performing the operation on the first block of memory cells includes operations, features, circuitry, logic, means, or instructions, or any combination thereof for performing a write operation or a block erase operation on the first block of memory cells.

Aspect 5: The method, apparatus, or non-transitory computer-readable medium of aspect 4, further including operations, features, circuitry, logic, means, or instructions, or any combination thereof for performing a second write operation or a second block erase operation on a third block of memory cells at the first storage density according to one or more third programming parameters, where the one or more third programming parameters are different from the one or more first programming parameters.

Aspect 6: The method, apparatus, or non-transitory computer-readable medium of aspect 5 where the one or more first programming parameters include a first duration to write one or more logic states to the first block of memory cells and the one or more third programming parameters include a second duration to write one or more logic states to the third block of memory cells, the first duration greater than the second duration.

Aspect 7: The method, apparatus, or non-transitory computer-readable medium of any of aspects 5 through 6 where the one or more first programming parameters include a first duration to erase one or more logic states stored at the first block of memory cells and the one or more third programming parameters include a second duration to erase one or more logic states stored at the third block of memory cells, the first duration greater than the second duration.

Aspect 8: The method, apparatus, or non-transitory computer-readable medium of any of aspects 5 through 7 where differences between respective threshold voltages of respective logic states stored at the first block of memory cells is greater than differences between respective threshold voltages of respective logic states stored at the third block of memory cells.

Aspect 9: The method, apparatus, or non-transitory computer-readable medium of any of aspects 1 through 8, further including operations, features, circuitry, logic, means, or instructions, or any combination thereof for setting an access mode of the first block of memory cells to a read-only mode based at least in part on selecting the first block of memory cells, where setting the one or more first programming parameters is based at least in part on setting the access mode of the first block of memory cells to read-only.

Aspect 10: The method, apparatus, or non-transitory computer-readable medium of any of aspects 1 through 9, further including operations, features, circuitry, logic, means, or instructions, or any combination thereof for receiving, at the memory system, a command to erase one or more logic states stored at the first block of memory cells or program the first block of memory cells, where performing the operation on the first block of memory cells according to the one or more first programming parameters is based at least in part on the command.

Aspect 11: The method, apparatus, or non-transitory computer-readable medium of any of aspects 1 through 10, further including operations, features, circuitry, logic, means, or instructions, or any combination thereof for determining that the condition of the first block of memory cells is satisfied.

Aspect 12: The method, apparatus, or non-transitory computer-readable medium of aspect 11 where determining that the condition of the first block of memory cells is satisfied includes operations, features, circuitry, logic, means, or instructions, or any combination thereof for determining that a quantity of program/erase operations performed on the first block of memory cells is below a first threshold; determining that a quantity of write operations performed on the first block of memory cells is below a second threshold; and determining that a quantity of read operations performed on the first block of memory cells is above a third threshold.

Aspect 13: The method, apparatus, or non-transitory computer-readable medium of any of aspects 1 through 12 where the memory system includes a plurality of pages and the method, apparatuses, and non-transitory computer-readable medium, further includes operations, features, circuitry, logic, means, or instructions, or any combination thereof for updating pages corresponding to the first block of memory cells from the second page type to the first page type based at least in part on performing the operation on the first block of memory cells according to the one or more first programming parameters.

Figure 8:
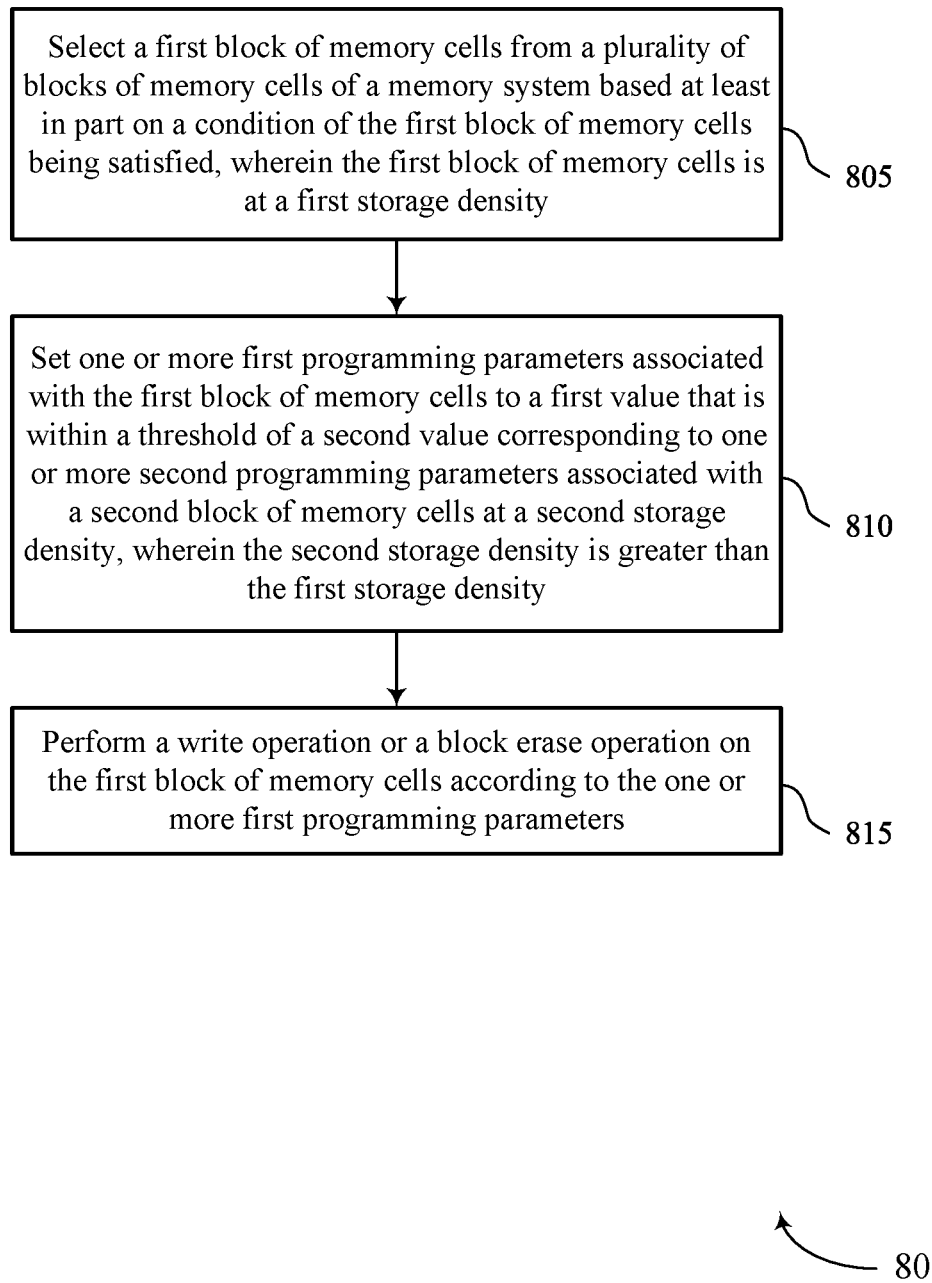

FIG. 8 shows a flowchart illustrating a method 800 that supports techniques for enhanced read performance on blocks of memory cells in accordance with examples as disclosed herein. The operations of method 800 may be implemented by a memory system or a host system or its components as described herein. For example, the operations of method 800 may be performed by a memory system or a host system as described with reference to FIGS. 1 through 6. In some examples, a memory system or a host system may execute a set of instructions to control the functional elements of the device to perform the described functions. Additionally or alternatively, the memory system or the host system may perform aspects of the described functions using special-purpose hardware.

At 805, the method may include selecting a first block of memory cells from a plurality of blocks of memory cells of a memory system based at least in part on a condition of the first block of memory cells being satisfied, where the first block of memory cells is at a first storage density. The operations of 805 may be performed in accordance with examples as disclosed herein. In some examples, aspects of the operations of 805 may be performed by a block selection component 625 as described with reference to FIG. 6.

At 810, the method may include setting one or more first programming parameters associated with the first block of memory cells to a first value that is within a threshold of a second value corresponding to one or more second programming parameters associated with a second block of memory cells at a second storage density, where the second storage density is greater than the first storage density. The operations of 810 may be performed in accordance with examples as disclosed herein. In some examples, aspects of the operations of 810 may be performed by a special page component 630 as described with reference to FIG. 6.

At 815, the method may include performing a write operation or a block erase operation on the first block of memory cells according to the one or more first programming parameters. The operations of 815 may be performed in accordance with examples as disclosed herein. In some examples, aspects of the operations of 815 may be performed by an access component 635 as described with reference to FIG. 6.

It should be noted that the methods described above describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if" "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A memory system, comprising:
one or more memory devices, each memory device comprising a plurality of blocks of memory cells, wherein each block of memory cells comprises a plurality of pages, and wherein each page is associated with one of a first page type or a second page type, the first page type allowing for pages of different storage densities to share programming parameters and the second page type allowing for pages of a same storage density to share programming parameters; and processing circuitry coupled with the one or more memory devices and configured to cause the memory system to:
select a first block of memory cells from the plurality of blocks of memory cells of a memory system based at least in part on a condition of the first block of memory cells being satisfied, wherein the first block of memory cells is at a first storage density;
update pages corresponding to the first block of memory cells from the second page type to the first page type based at least in part on selecting the first block of memory cells;
set, based at least in part on the first page type, one or more first programming parameters associated with the first block of memory cells to a first value that is within a threshold of a second value corresponding to one or more second programming parameters associated with a second block of memory cells at a second storage density, wherein the second storage density is greater than the first storage density; and
perform an operation on the first block of memory cells according to the one or more first programming parameters.

2. The memory system of claim 1, wherein, to perform the operation on the first block of memory cells, the processing circuitry is configured to cause the memory system to:
perform a write operation or a block erase operation on the first block of memory cells.

3. The memory system of claim 2, wherein the processing circuitry is further configured to cause the memory system to:
perform a second write operation or a second block erase operation on a third block of memory cells at the first storage density according to one or more third programming parameters, wherein the one or more third programming parameters are different from the one or more first programming parameters.

4. The memory system of claim 3, wherein:
the one or more first programming parameters comprise a first duration to write one or more logic states to the first block of memory cells and the one or more third programming parameters comprise a second duration to write one or more logic states to the third block of memory cells, the first duration greater than the second duration.

5. The memory system of claim 3, wherein:
the one or more first programming parameters comprise a first duration to erase one or more logic states stored at the first block of memory cells and the one or more third programming parameters comprise a second duration to erase one or more logic states stored at the third block of memory cells, the first duration greater than the second duration.

6. The memory system of claim 3, wherein differences between respective threshold voltages of respective logic states stored at the first block of memory cells is greater than differences between respective threshold voltages of respective logic states stored at the third block of memory cells.

7. The memory system of claim 1, wherein the processing circuitry is further configured to cause the memory system to:
set an access mode of the first block of memory cells to a read-only mode based at least in part on selecting the first block of memory cells, wherein setting the one or more first programming parameters is based at least in part on setting the access mode of the first block of memory cells to read-only.

8. The memory system of claim 1, wherein the processing circuitry is further configured to cause the memory system to:
receive, at the memory system, a command to erase one or more logic states stored at the first block of memory cells or program the first block of memory cells, wherein performing the operation on the first block of memory cells according to the one or more first programming parameters is based at least in part on the command.

9. The memory system of claim 1, wherein the processing circuitry is further configured to cause the memory system to:
determine that the condition of the first block of memory cells is satisfied.

10. The memory system of claim 9, wherein, to determine that the condition of the first block of memory cells is satisfied, the processing circuitry is configured to cause the memory system to:
determine that a quantity of program/erase operations performed on the first block of memory cells is below a first threshold;
determine that a quantity of write operations performed on the first block of memory cells is below a second threshold; or determine that a quantity of read operations performed on the first block of memory cells is above a third threshold.

11. The memory system of claim 1, wherein the processing circuitry is further configured to cause the memory system to:
update a storage density of the first block of memory cells from a third storage density to the first storage density, wherein the third storage density is greater than the first storage density.

12. The memory system of claim 11, wherein the third storage density comprises one of multi-level cell storage, triple level cell storage, or quad level cell storage and the first storage density comprises one of single level cell storage, multi-level cell storage, triple level cell storage, or quad level storage different from the third storage density.

13. A non-transitory computer-readable medium storing code comprising instructions which, when executed by one or more processors of an electronic device, cause the electronic device to:
select a first block of memory cells from a plurality of blocks of memory cells of a memory system based at least in part on a condition of the first block of memory cells being satisfied, wherein the first block of memory cells is at a first storage density, and wherein each block of memory cells of the plurality of blocks of memory cells comprises a plurality of pages, and wherein each page is associated with one of a first page type or a second page type, the first page type allowing for pages of different storage densities to share programming parameters and the second page type allowing for pages of a same storage density to share programming parameters;
update pages corresponding to the first block of memory cells from the second page type to the first page type based at least in part on selecting the first block of memory cells;

set, based at least in part on the first page type, one or more first programming parameters associated with the first block of memory cells to a first value that is within a threshold of a second value corresponding to one or more second programming parameters associated with a second block of memory cells at a second storage density, wherein the second storage density is greater than the first storage density; and perform an operation on the first block of memory cells according to the one or more first programming parameters.

14. The non-transitory computer-readable medium of claim 13, wherein the instructions to perform the operation on the first block of memory cells, which when executed by one or more processors of the electronic device, cause the electronic device to:

perform a write operation or a block erase operation on the first block of memory cells.

15. The non-transitory computer-readable medium of claim 14, wherein the instructions, which when executed by the one or more processors of the electronic device, further cause the electronic device to:

perform a second write operation or a second block erase operation on a third block of memory cells at the first storage density according to one or more third programming parameters, wherein the one or more third programming parameters are different from the one or more first programming parameters.

16. The non-transitory computer-readable medium of claim 15, wherein:

the one or more first programming parameters comprise a first duration to write one or more logic states to the first block of memory cells and the one or more third programming parameters comprise a second duration to write one or more logic states to the third block of memory cells, the first duration greater than the second duration.

17. The non-transitory computer-readable medium of claim 15, wherein:

the one or more first programming parameters comprise a first duration to erase one or more logic states stored at the first block of memory cells and the one or more third programming parameters comprise a second duration to erase one or more logic states stored at the third block of memory cells, the first duration greater than the second duration.

18. The non-transitory computer-readable medium of claim 15, wherein differences between respective threshold voltages of respective logic states stored at the first block of memory cells is greater than differences between respective threshold voltages of respective logic states stored at the third block of memory cells.

19. The non-transitory computer-readable medium of claim 13, wherein the instructions, which when executed by the one or more processors of the electronic device, further cause the electronic device to:

set an access mode of the first block of memory cells to a read-only mode based at least in part on selecting the first block of memory cells, wherein setting the one or more first programming parameters is based at least in part on setting the access mode of the first block of memory cells to read-only.

20. The non-transitory computer-readable medium of claim 13, wherein the instructions, which when executed by the one or more processors of the electronic device, further cause the electronic device to:

receive, at the memory system, a command to erase one or more logic states stored at the first block of memory cells or program the first block of memory cells, wherein performing the operation on the first block of memory cells according to the one or more first programming parameters is based at least in part on the command.

21. The non-transitory computer-readable medium of claim 13, wherein the instructions, which when executed by the one or more processors of the electronic device, further cause the electronic device to:

determine that the condition of the first block of memory cells is satisfied.

22. The non-transitory computer-readable medium of claim 13, wherein the instructions to determine that the condition of the first block of memory cells is satisfied, which when executed by the one or more processors of the electronic device, cause the electronic device to:

determine that a quantity of program/erase operations performed on the first block of memory cells is below a first threshold;

determine that a quantity of write operations performed on the first block of memory cells is below a second threshold; or determine that a quantity of read operations performed on the first block of memory cells is above a third threshold.

23. The non-transitory computer-readable medium of claim 13, wherein the instructions, which when executed by the one or more processors of the electronic device, further cause the electronic device to:

update a storage density of the first block of memory cells from a third storage density to the first storage density, wherein the third storage density is greater than the first storage density.

24. A method, comprising:

selecting a first block of memory cells from a plurality of blocks of memory cells of a memory system based at least in part on a condition of the first block of memory cells being satisfied, wherein the first block of memory cells is at a first storage density, and wherein each block of memory cells of the plurality of blocks of memory cells comprises a plurality of pages, and wherein each page is associated with one of a first page type or a second page type, the first page type allowing for pages of different storage densities to share programming parameters and the second page type allowing for pages of a same storage density to share programming parameters;

updating pages corresponding to the first block of memory cells from the second page type to the first page type based at least in part on selecting the first block of memory cells;

setting, based at least in part on the first page type, one or more first programming parameters associated with the first block of memory cells to a first value that is within a threshold of a second value corresponding to one or more second programming parameters associated with a second block of memory cells at a second storage density, wherein the second storage density is greater than the first storage density; and performing an operation on the first block of memory cells according to the one or more first programming parameters.

* * * * *